(12) United States Patent
Kimura et al.

(10) Patent No.: US 6,400,034 B1
(45) Date of Patent: Jun. 4, 2002

(54) SEMICONDUCTOR DEVICE

(75) Inventors: Takehiro Kimura; Seiya Isozaki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/614,314

(22) Filed: Jul. 12, 2000

(30) Foreign Application Priority Data

Jul. 12, 1999 (JP) .......................................... 11-197285

(51) Int. Cl.[7] .............................................. H01L 23/48
(52) U.S. Cl. ...................................... 257/778; 257/737
(58) Field of Search ................................ 257/738, 693, 257/787, 668, 778, 666, 736, 774, 781, 784; 438/118

(56) References Cited

U.S. PATENT DOCUMENTS

| | | | | |
|---|---|---|---|---|
| 5,604,379 A | * | 2/1997 | Mori .......................... | 257/738 |
| 5,672,912 A | * | 9/1997 | Aoki et al. ................. | 257/693 |
| 5,874,784 A | * | 2/1999 | Aoki et al. ................. | 257/787 |
| 5,892,271 A | * | 4/1999 | Takeda et al. .............. | 257/668 |
| 5,953,592 A | * | 9/1999 | Taniguchi et al. .......... | 438/118 |
| 6,140,707 A | * | 10/2000 | Plepys et al. ............... | 257/778 |
| 6,232,650 B1 | * | 5/2001 | Fujisawa et al. ........... | 257/666 |

* cited by examiner

Primary Examiner—David Nelms
Assistant Examiner—Bau T Le
(74) Attorney, Agent, or Firm—Hutchins, Wheeler & Dittmar (57) ABSTRACT

A semiconductor device allowing a finer terminal pitch, a low profile, and easy product inspection is disclosed. A semiconductor device includes a semiconductor chip and a film substrate having the semiconductor chip connected thereon. The film substrate includes an insulating film having a plurality of openings formed in a desired pattern and a wiring layer formed in a chip-connecting surface of the insulating film. Solder balls are each directly bonded to the external connection pads through the openings. The wiring layer includes substrate pads each being connected to the chip pads of the semiconductor chip, and external connection pads each being electrically connected to these substrate pads. The external connection pads are each formed over the openings so that the openings are covered with the external connection pads on the chip-connecting surface of the insulating film, respectively.

18 Claims, 9 Drawing Sheets

SEMICONDUCTOR DEVICE

BACKGROUND OF THE INVENTION

1. Field of the Invention

The present invention relates to a semiconductor device manufactured by using a flip chip connection to form external connection terminals.

2. Description of the Prior Art

There has been disclosed a semiconductor device manufactured by using a flip chip connection method in Japanese Patent Application Unexamined Publication No. 8-279571.

Figure 1:
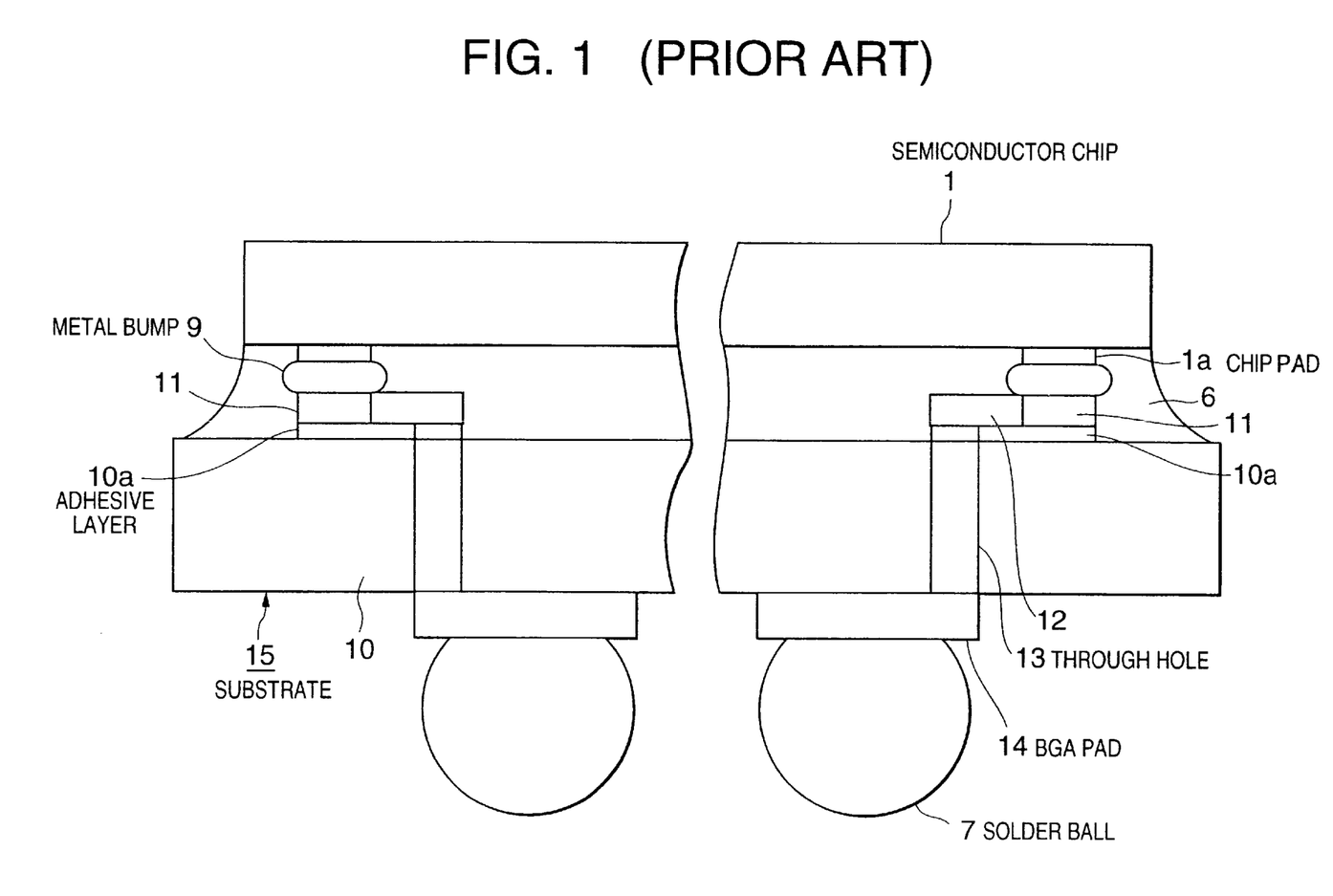
FIG 1 is a sectional view illustrating an example of a conventional semiconductor device.

FIG. 1 shows an example of such a conventional semiconductor device. In FIG. 1, a semiconductor chip 1 is mounted on a substrate 15 through metal bumps 9 for connection. For a substrate material, a ceramic, a glass epoxy resin, or a plastic film may be used. Here, the substrate 15 is composed of a thin, flexible plastic film 10 having pads 11 and wiring conductors 12 formed on the top surface thereof through an adhesive layer 10a and having BGA (Ball Grid Array) pads 14 formed on the bottom surface thereof. A pad 11 and the corresponding wiring conductor 12 are electrically connected to the corresponding BGA pad by a through hole 13.

On this substrate 15, the semiconductor chip 1 is positioned such that the chip pads 1a of the semiconductor chip 1 are aligned with the pads 11 of the substrate 15, and then thermocompression bonding is performed to mechanically and electrically connect the chip pads 1a with the pads 11 through, for example, metal bumps 9 such as tin, solder or the like. For example, in case of using tin as the metal bump, a force of 75 to 100 g per one bump is applied, keeping a temperature of bonding site 350° C. for 10 seconds in bonding operation.

Solder balls 7 are bonded to the BGA pads 14 to form external connection terminals, respectively. The space between the semiconductor chip 1 and the substrate 15 is filled with sealing resin 6, which reinforces the coupling between the semiconductor chip 1 and the substrate 15 and also protects the surface of the semiconductor chip 1.

A resin-filling step is carried out very carefully to avoid the mixing of bubbles into the sealing resin 6. The semiconductor device completed is placed on a printed substrate and is heated in a reflow furnace or the like. As a result, the solder balls 7 melt and solder connections are made. If there is a void (a part in which the bubble is present) in the resin 6 when the semiconductor device is heated to become a high temperature, then inside air is expanded to explode the bubble, resulting in a damage of the semiconductor device. For prevention of this, degas operation is carried out in the resin-filling step by vacuum pumping for 10 minutes to remove the bubble in the resin filled.

Meanwhile, in the conventional semiconductor device as described above, the respective chip pads 1a of the semiconductor chip 1 are bonded to the substrate pads 11 by thermocompression bonding. However, a temperature condition in manufacturing steps sometimes caused a bad effect on a reliability of the semiconductor device. In the case of a low temperature in flip chip connection, the connecting part between the chip and the substrate has been insufficiently bonded to lower the reliability. Contrarily, in the case of a high temperature, the semiconductor chip may be deteriorated.

In the case of using a glass epoxy substrate for the substrate 15, a low heat-resistant temperature thereof does not allow other choice than a material such as a solder or the like, which can be bonded at a relatively low temperature. However, using solder bumps is easy to cause a short circuit. As measures for this defect, respective pads have to be arranged with a certain distance, causing difficulties in making a fine pitch.

In order to solve this problem, a plastic film made of a material excellent for heat resistance, such as a polyimide, is used for the substrate. However, the conventional semiconductor device using the film substrate as shown in FIG. 1 has an adhesive layer 10a, resulting in insufficient heat resistance. Therefore, the temperature in flip chip connection requires to be set low and the metal usable for the connecting part is restricted to tin (melting point: about 232° C.) to keep reliability. In addition, also having the adhesive layer 10a causes sinking of the connecting part by applying a high pressure in thermocompression bonding to lower the reliability of the connection.

There is another structural problem in the conventional semiconductor device such that the substrate structure becomes complicated because of through holes. As a result, the semiconductor device becomes costly.

In general, semiconductor devices to be shipped satisfy prescribed specifications by various inspections for product quality management or are ones of a lot simultaneously manufactured with one satisfying the specifications. Inspection of electric characteristics is conducted for a semiconductor device as a whole and also physical inspections are conducted For example, it is very difficult to perfectly prevent the mixing of air bubbles into the sealing resin because of a microscopic step formed at a boundary region between the substrate and the wiring layer. Therefore, a 100% inspection or a sampling inspection for confirmation of no void is conducted by using an SAT machine in application of an ultrasonic wave to find and remove the semiconductor device out of the specificity.

Therefore, in view of product inspection, much inspection time is required because quality of connecting condition of the flip chip connecting part can be confirmed only by an indirect method such as an electricity flowing test. Likewise, quality of sealing condition by the sealing resin, that is, presence or absence of void, can be tested only by a large scale inspection instrument such as an ultrasonic machine. Thus, a simple inspection method is desired.

SUMMARY OF THE INVENTION

An object of the present invention is to provide a high reliable semiconductor device with a chip-size package that has solved the above-mentioned problems.

Another object of the present invention is to provide a semiconductor device allowing further miniaturization with a finer terminal pitch.

Further another object of the present invention is to provide a semiconductor device allowing easy inspection of products.

According to the present invention, a semiconductor device includes a semiconductor chip having a plurality of chip pads formed on one side thereof in a predetermined pattern and a film substrate having the semiconductor chip connected thereon. The film substrate includes an insulating film having a plurality of openings formed in a desired pattern; a wiring layer formed on a chip-connecting surface of the insulating film; and a plurality of solder balls each directly bonded to the external connection pads through the openings. The wiring layer includes a plurality of substrate pads arranged in the predetermined pattern, the substrate pads each being connected to the chip pads of the semiconductor chip; and a plurality of external connection pads each being electrically connected to the substrate pads, the external connection pads each being formed over the openings so that the openings are covered with the external connection pads on the chip-connecting surface of the insulating film, respectively.

As described above, the film substrate having the wiring layer formed thereon is used to connect the chip pads of the semiconductor chip to respective ones of the substrate pads of the wiring layer. Therefore, a low-profile semiconductor device with finer pitch can be achieved with lower manufacturing cost.

Further, since the solder balls are directly bonded to respective ones of the external connect on pads of the wiring layer, easy manufacturing and Is allowed and a lower-profile semiconductor device can be achieved.

Preferably, a diameter of each of the openings tapers down in a direction toward the chip-connecting surface of the insulating film. This causes the solder balls to be easily and reliably bonded to the respective ones of the external connection pads. According to this structure, the tapered opening contains a solder ball suitably to surely connect it to a corresponding external connection pad, and the solder ball with a small diameter can be used to realize the semiconductor device further miniaturized with a finer terminal pitch.

Further preferably, the insulating film is substantially transparent. This allows easy visual inspections of the alignment and interconnections in the semiconductor device.

Each of the substrate pads of the film substrate may be connected to a corresponding one of the chip pads of the semiconductor chip through a bump made of gold. Preferably, at least the substrate pads of the wiring layer are gold-plated to provide a gold-gold bond between the semiconductor chip and the film substrate. The gold-gold bond can achieve high reliability of the semiconductor device. In this case, the insulating film is preferably made of a material having high-temperature resistance such as polyimide.

The substrate pads of the film substrate may be each connected to respective ones of the chip pads of the semiconductor chip after surfaces of the substrate pads have been subject to plasma cleaning processing. The plasma cleaning processing allows the time required for heating and pressing to be reduced and the bonding strength to be increased.

A space between the film substrate and the semiconductor chip is preferably filled with a sealing resin mixed with filler. Conductive filler may be added to the sealing resin to make a configuration improve heat resistance and the filler may be a metal body to add a shielding effect on an electromagnetic wave.

BRIEF DESCRIPTION OF THE DRAWINGS

FIG. 3 is an enlarged plan view showing the back of the semiconductor device of the embodiment when the respective bumps 2 are aligned with the substrate pads 4a;

FIG. 4 is an enlarged plan view showing the back of the semiconductor device of the embodiment when the respective bumps 2 are not aligned with the substrate pads 4a;

DETAILED DESCRIPTION OF THE PREFERRED EMBODIMENTS

Device Structure

Figure 2:
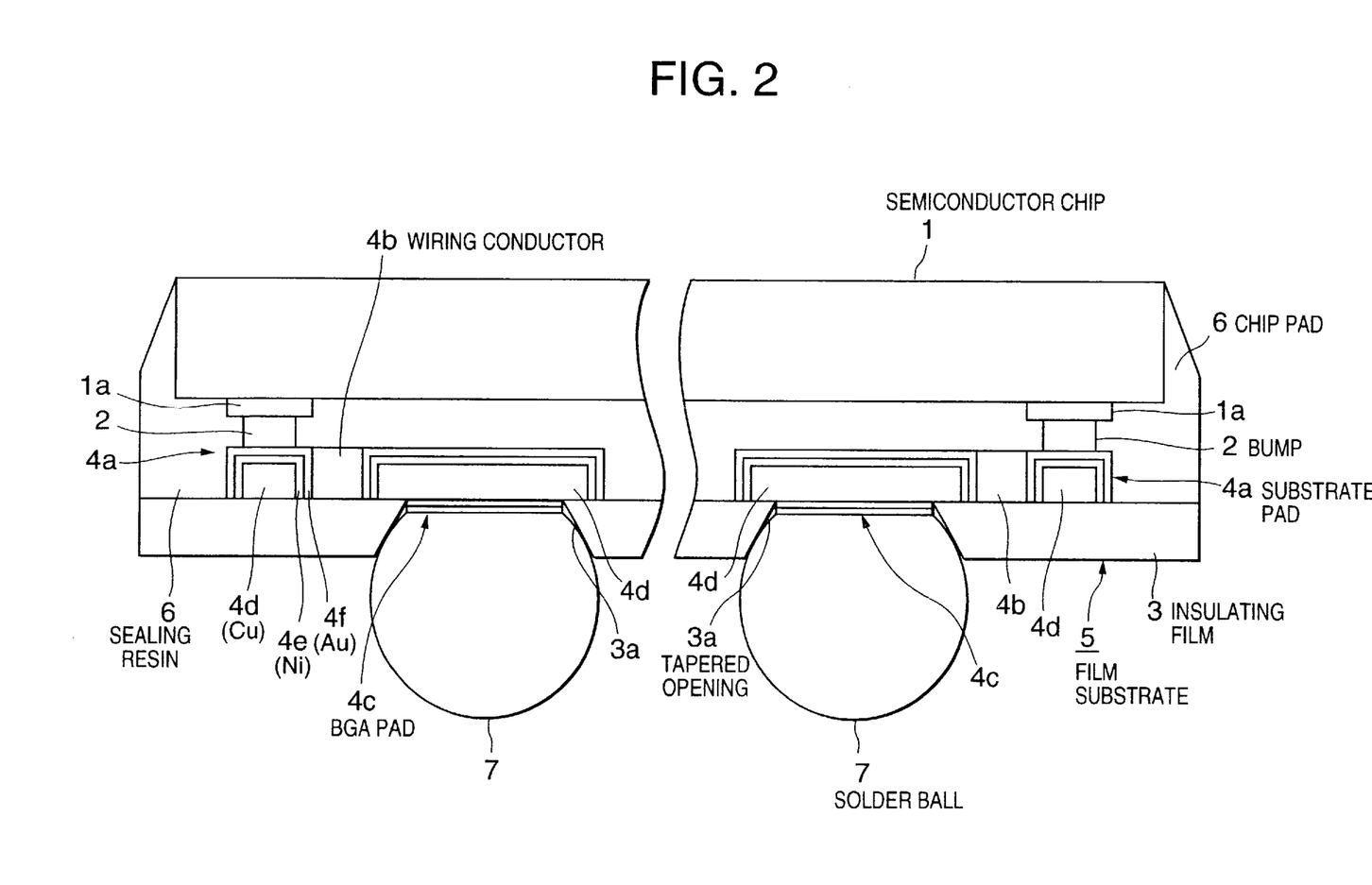
FIG. 2 is a sectional view showing the semiconductor device of an embodiment according to the present invention.

Referring to FIG. 2, a semiconductor device according to an embodiment of the present invention has a flip chip connection structure such that a semiconductor chip 1 is electrically connected and fixed to a film substrate 5 by bumps 2 and sealing resin 6. The semiconductor chip 1 has a plurality of chip pads 1a formed on the bottom surface thereof in a predetermined pattern. The film substrate 5 has a plurality of solder balls 7 formed in the bottom side thereof.

The film substrate 5 is composed of an insulating film 3 and a wiring layer formed on the chip-connecting surface of the insulating film 3. More specifically, the film substrate 5 has a plurality of substrate pads 4a, wiring conductors 4b, and BGA pads 4c formed on the chip-connecting surface thereof. As described later, the substrate pads 4a are arranged in the predetermined pattern so that the substrate pads 4a are aligned with the chip pads 1a of the semiconductor chip 1. Each of the substrate pads 4a is connected to a corresponding BGA pad through a wiring conductor 4b.

The insulating film 3 has a plurality of tapered openings 3a each formed at positions of the BGA pads 4c. Each of the tapered openings 3a is formed by tapering its diameter in a direction toward the chip-connecting surface of the insulating film 3. Preferably, an angle between the bottom surface of a BGA pad 4c and the tapered side wall of a corresponding opening 3a is equal to or greater than 120 degrees to allow easy bonding of a solder ball 7.

The respective substrate pads 4a of the film substrate 5 are fixed and electrically connected to the chip pads 1a of the semiconductor chip 1 by the bumps 2 that are made of Au. The space formed between the semiconductor chip 1 and the film substrate 5 are filled with the sealing resin 6.

Since the insulating film 3 has the tapered openings 3a each formed at positions of the BGA pads 4c, the bottom surface of each of the BGA pads 4c is exposed through the tapered openings 3a. Therefore, solder balls 7 as external connection terminals can be directly formed on the BGA pads 4c through the tapered openings 3a, respectively.

The insulating film 3 of the film substrate 5 is made of a sufficiently thin and substantially clear polyimide film (not necessary of colorless). The substrate pads 4a may be formed by adhering directly to the chip-connecting surface of the polyamide film 3. Practically, the substrate pads 4a, the wiring conductors 4b, and the BGA pads 4c are integrally and simultaneously formed as the wiring layer by etching or the like. In this manner, the film substrate 5 is configured by two layers of the polyimide insulating film 3 and the wiring layer.

Figure 3:
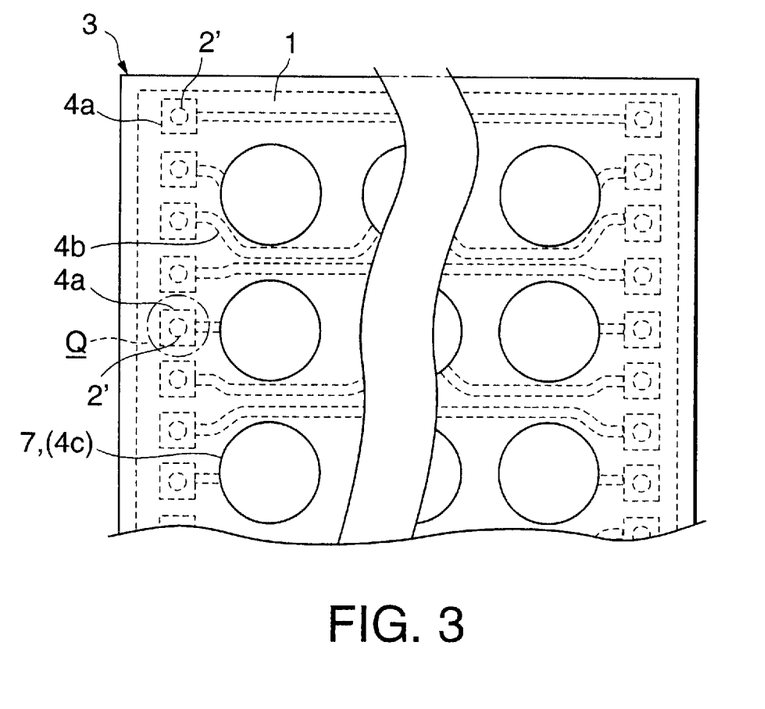
Figure 4:
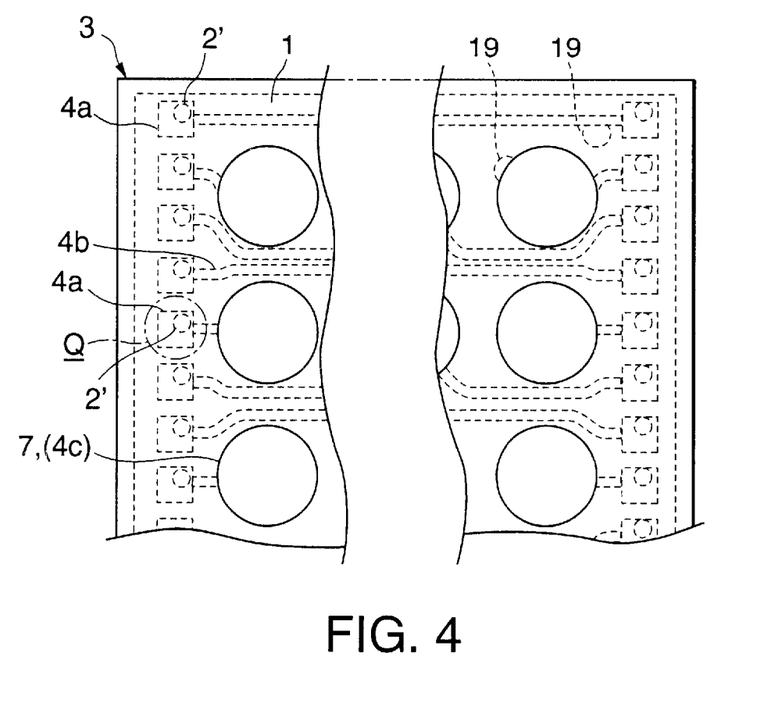

As shown in FIGS. 3 and 4, the polyimide film 3 as described above should be transparent to the extent of allowing optical inspection of internal arrangement of pads and conductors from outside after having assembled the semiconductor device. A colored polyimide film 3 may be allowed, if this condition is satisfied The case where optical inspection is possible by lighting from outside should be included. Taking a commercially available polyimide film as an example, those having an ordinary turbidity and a thickness of 100 $\mu$m or less are suitable as a member used in the present invention. The polyimide film is excellent for heat resistance and therefore, preferable as a material of the film substrate 5 of the present invention.

EXAMPLE

The practical sizes of respective parts of the semiconductor device of the present embodiment will be illustrated below. The size of the semiconductor chip 1 is 7×14×0.3 mm. An Au bump 2 having a diameter of 100 $\mu$m and a height of 30 $\mu$m is formed on a corresponding chip pad 1a of the semiconductor chip 1 by ball bonding.

The size of a chip pad la and a substrate pad 4a is 90 $\mu$m square. The chip pad 1a has an area of 59 pins and the minimum pitch thereof is 120 $\mu$m.

The polyimide film 3 used in the film substrate 5 is 50 $\mu$m thick. The wiring layer is mainly made of copper (Cu) and may be formed directly on one face of the polyimide film 3 by electrolytic plating. There Is no adhesive layer between the polyimide film 3 and the wiring layer. Therefore, the wiring layer is excellent for heat resistance and also high in rigidity in a direction of thickness as a whole.

More specifically, the wiring layer (the substrate pads 4a, the wiring conductors 4b and the BGA pads 4c) is composed of a copper layer 4d which is given nickel(Ni)-plating and finish Au-plating to be covered with a Ni layer 4e and an Au layer 4f as shown in FIG. 1. Here, the wiring layer is configured in a triple-layer structure of Cu/Ni/Au, each being 18/2/1 $\mu$m thick. Either the minimum line width or the minimum space in the wiring layer is 30 $\mu$m.

As described above, the outermost layer of each substrate pad 4a is the Au layer 4f. In the device of the present invention, therefore, an Au—Au bond is formed by thermocompression bonding between the outermost layer and the bump 2 made of the Au material. Thus, the substrate pads 4a may be composed of the copper layer 4d directly plated with Au.

The chip pads 1a of the semiconductor chip 1 are made of aluminum (Al). Each of the chip pads 1a is crimped and electrically connected to a corresponding one of the substrate pads 4a through the Au bump 2. Therefore, the connection between the semiconductor chip 1 and the film substrate 5 is the Au—Au connection to provide high reliability. The magnitude of connection strength is about 50 gf per pin.

The respective external connection terminals of the semiconductor device are formed by bonding the solder balls 7 to the corresponding BGA pads 4c in the tapered openings 3a from the bank face of the film substrate 5. Here, the film substrate 5 is provided with 68 BGA pads 4c, each being 0.35 mm in diameter and 0.75 mm in lattice pitch. Each of the solder balls 7 is of 0.5-mm diameter. The solder balls 7 will be connected to a motherboard (not illustrated) As described above, the outermost layer of each BGA pad 4c facing the corresponding tapered opening 3a is also the Au layer 4f. Therefore, the solder ball 7 IS directly formed on the Au layer 4f of the BGA pad 4c, resulting in easy formation of solder balls.

Further, since the diameter of a tapered opening 3a is increased in the direction toward the bottom surface of the insulating film 3, it is possible to use a solder ball, the diameter of which is larger than that of the BGA pad. Therefore, the necessary area for BGA pad is reduced, resulting in the increased freedom of wiring.

The space between the semiconductor chip 1 and the film substrate 5 is filled with the sealing resin 6 such as an epoxy-based resin or the like. The sealing resin 6 plays a role of reinforcing strength of connection between a chip pad 1a and a corresponding substrate pad 4a and further protecting the surface of the semiconductor chip 1. The strength of connection between the semiconductor chip 1 and the film substrate 5 is kept to 300 gf or more per pin after filled with the sealing resin 6.

The final external size of the semiconductor device is 7.5 mm×14.5 mm larger by 0.5 mm in each side than the size of the chip 1, and the thickness thereof is kept to 0.8 mm including the solder ball part.

MANUFACTURING PROCESS

Subsequently, manufacturing steps of the semiconductor device will be described below in outline with reference to FIGS. 5 to 10.

Figure 5:
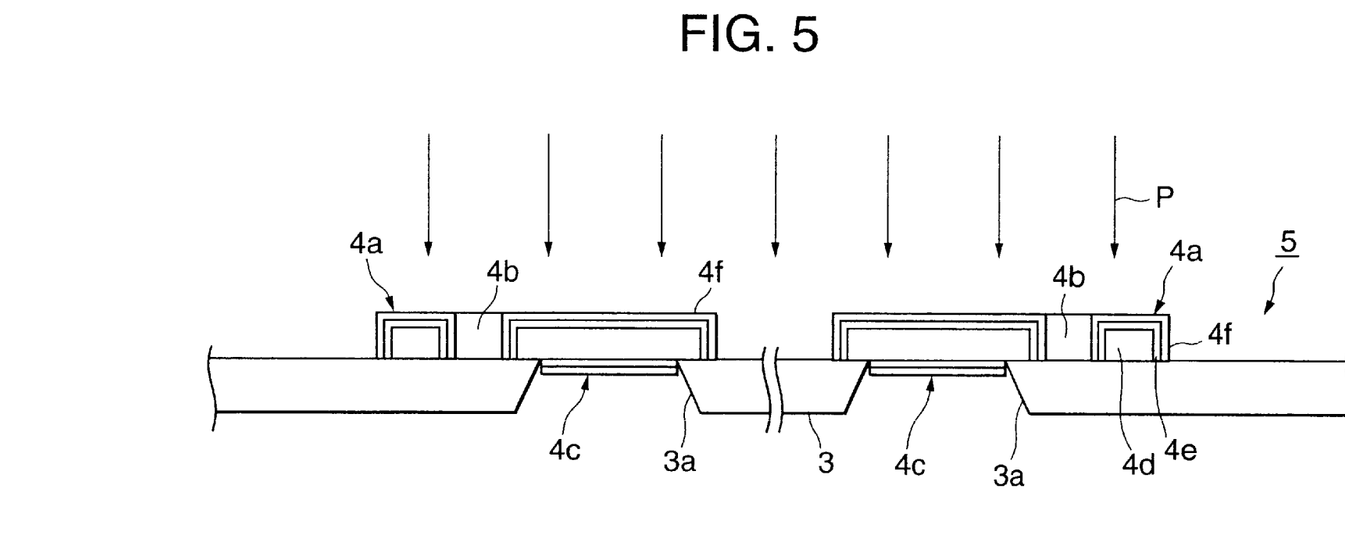
FIG. 5 is a sectional view illustrating a film substrate in manufacturing of the semiconductor device according to the embodiment.

As shown in FIG. 5, a tape having the substrate pads 4a and the BGA pads 4c already formed thereon is prepared as the film substrate 5. The chip-connecting surface of the tape 5 is irradiated with plasma indicated by P that is generated by a plasma processing device (not illustrated). This causes organic impurities to be removed from the surface of the Au layer 4f of the wiring layer. The condition of the plasma processing in this case is as follows; Ar gas flow rate=50 ml/min (normally 10 to 100 ml/min), pressure =65 mTorr (normally 50 to 500 mTorr), RF power=400 W (normally 50 to 500 W), and the processing time=180 sec (normally 60 to 300 sec). Here, the thickness of the Au layer 4f is 1 $\mu$m (normal Au plating thickness ranges about 0.03 to 2 $\mu$m).

Figure 6:
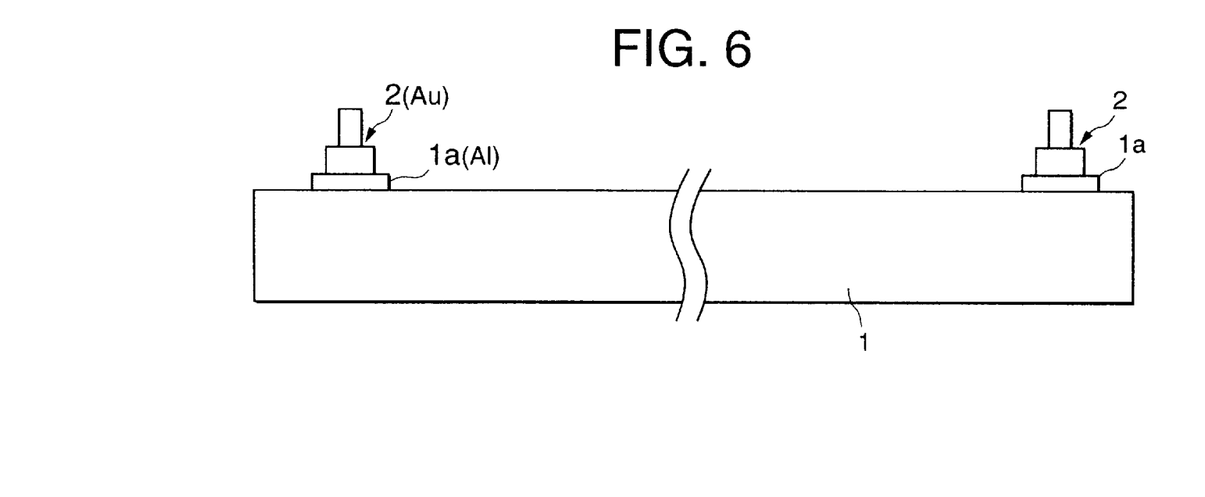
FIG. 6 is a sectional view illustrating a semiconductor chip in manufacturing of the semiconductor device according to the embodiment.

As shown in the FIG. 6, on each of the Al chip pads id of the semiconductor chip 1, an Au bump 2 is formed by ball bonding. Alternatively, plating method or other methods may be employed for Au bump formation. Further, the chip pads 1a of the semiconductor chip 1 may be formed with Cu or other materials.

Figure 7:
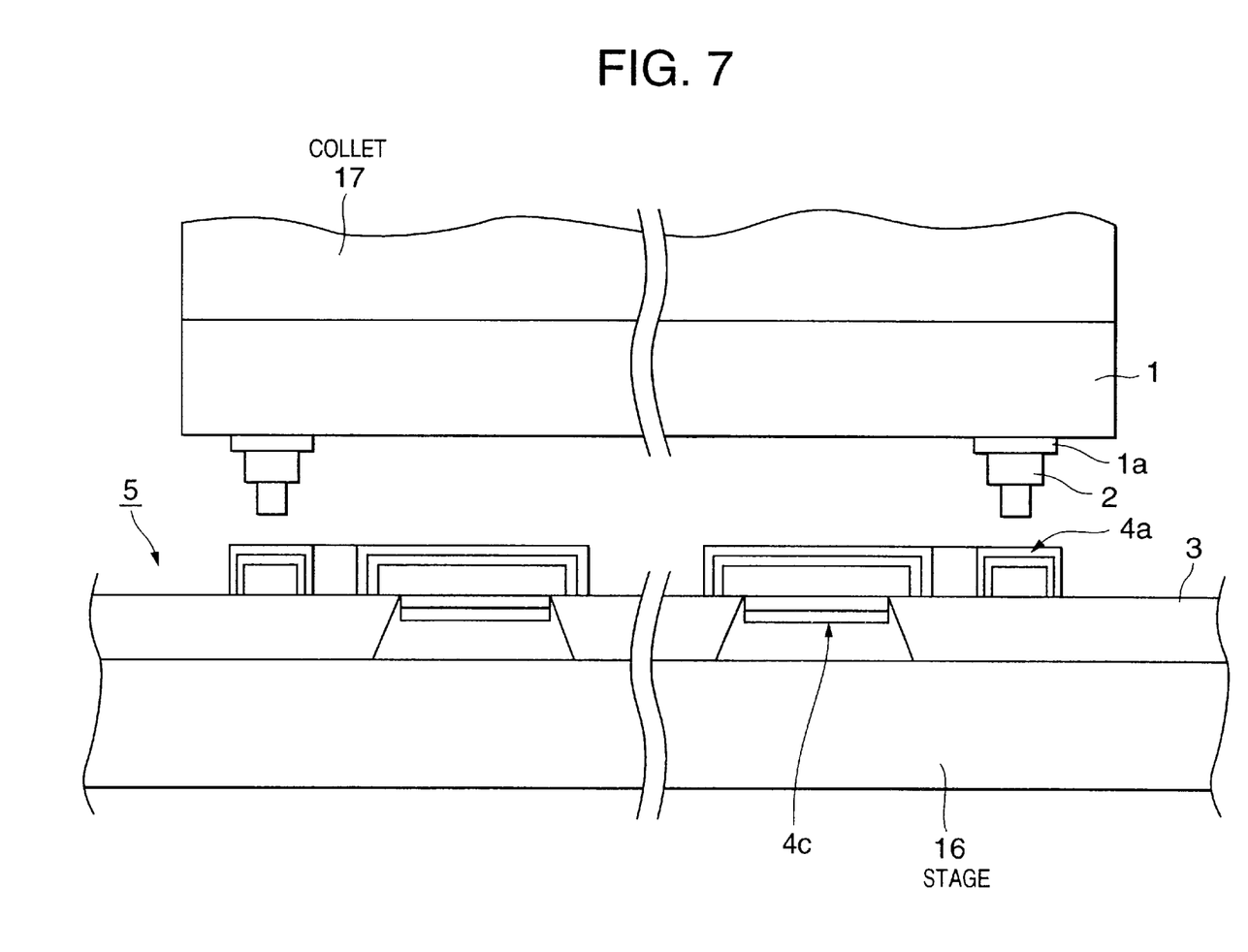
FIG. 7 is a diagram illustrating the alignment of the semiconductor chip with the film substrate in the manufacturing step of the semiconductor device of the embodiment.

Subsequently, as shown in FIG. 7, a collect 17 is used to adsorb the semiconductor chip 1 having the Au bumps 2 formed on the chip pads 1a. On the other hand, the tape 5 is placed on a stage 16. The semiconductor chip 1 Is turned upside down and is moved directly above the tape 5 at the position where the chip pads 1a of the semiconductor chip 1 are aligned with the substrate pads 4a of the tape 5.

Figure 8:
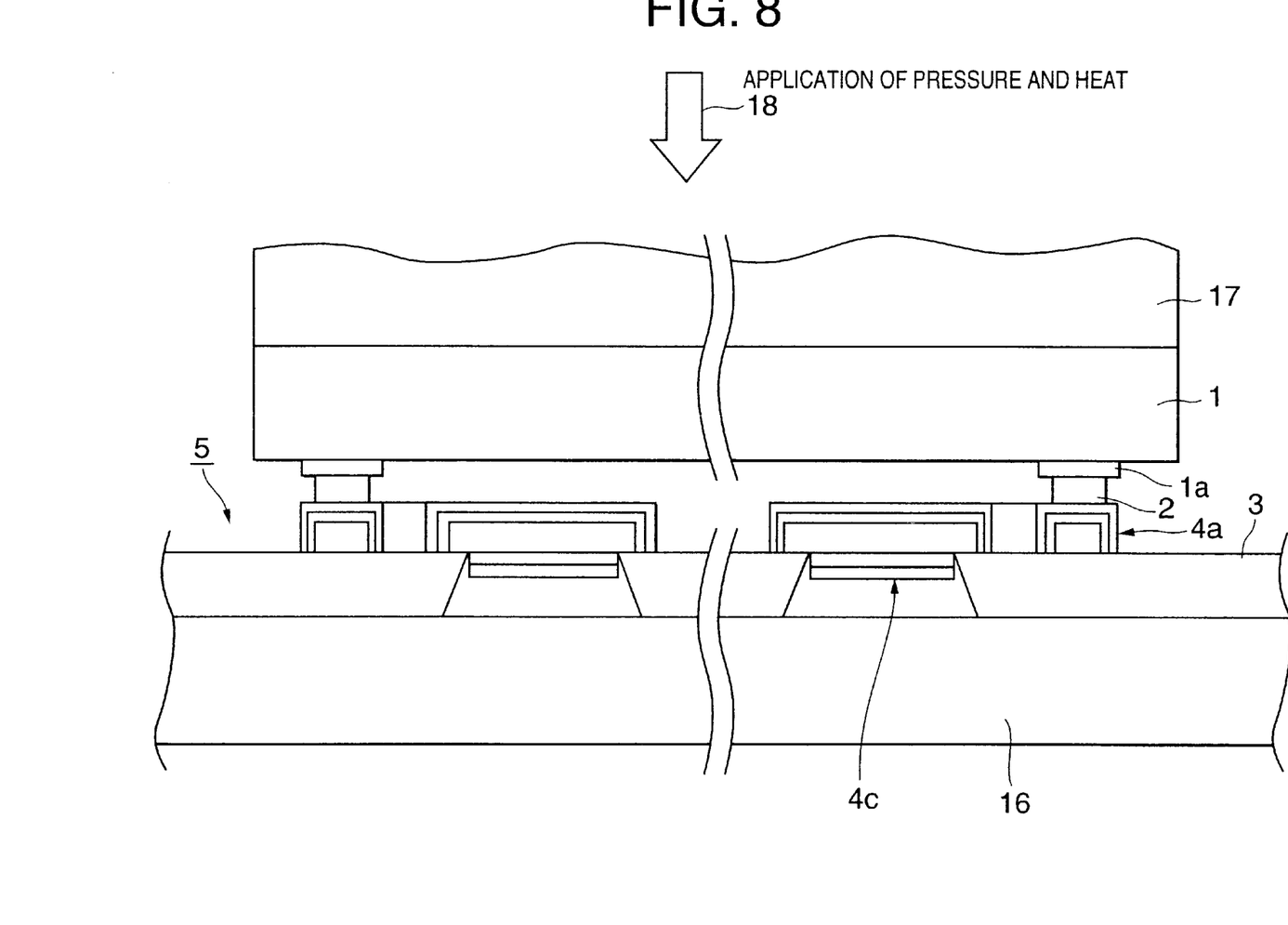
FIG. 8 is a diagram illustrating the thermocompression bonding in the manufacturing step of the semiconductor device of the embodiment.

Thereafter, as shown in FIG. 8, application of pressure and heat is conducted in a direction as Indicated by reference numeral 18 to operate thermocompression bonding of the Au bumps 2 of the semiconductor chip 1 to the substrate pads 4a of the tape 5.

Here, the condition of thermocompression bonding is as follows: temperature of the stage 16 is 70° C., temperature Of the collect 17 is 300° C., the pressure and heat application time is 2.5 sec to 7.5 sec, and applied pressure is 75 to 125 gf/bump. Irradiation with plasma allows the heating temperature to be decreased and the pressure and heat application time to be reduced.

Figure 9:
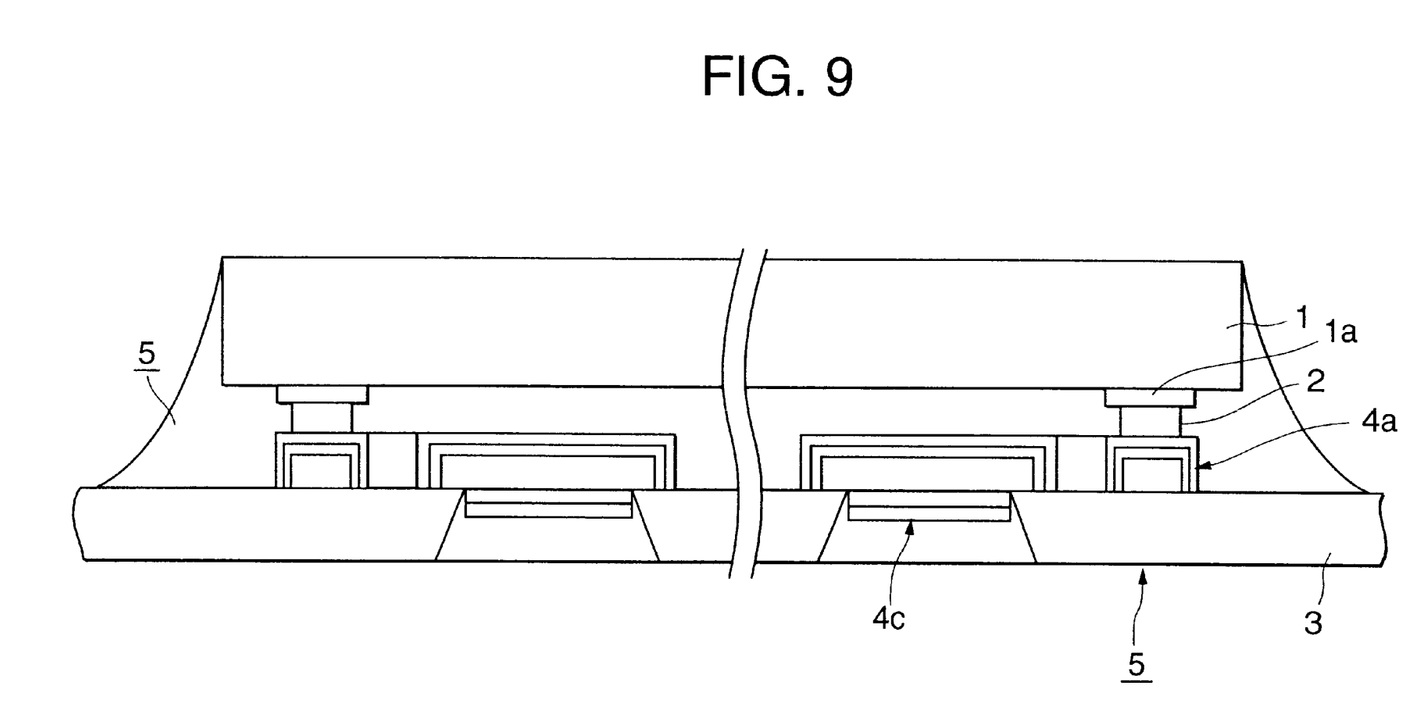
FIG. 9 is a sectional view illustrating a semiconductor device in the resin-filling step.

As shown in FIG. 9, the sealing resin 6 is poured into the space between the semiconductor chip 1 and the tape 5 and then is hardened by heating. In this way, a plurality of semiconductor devices are formed on the tape 5

Figure 10:
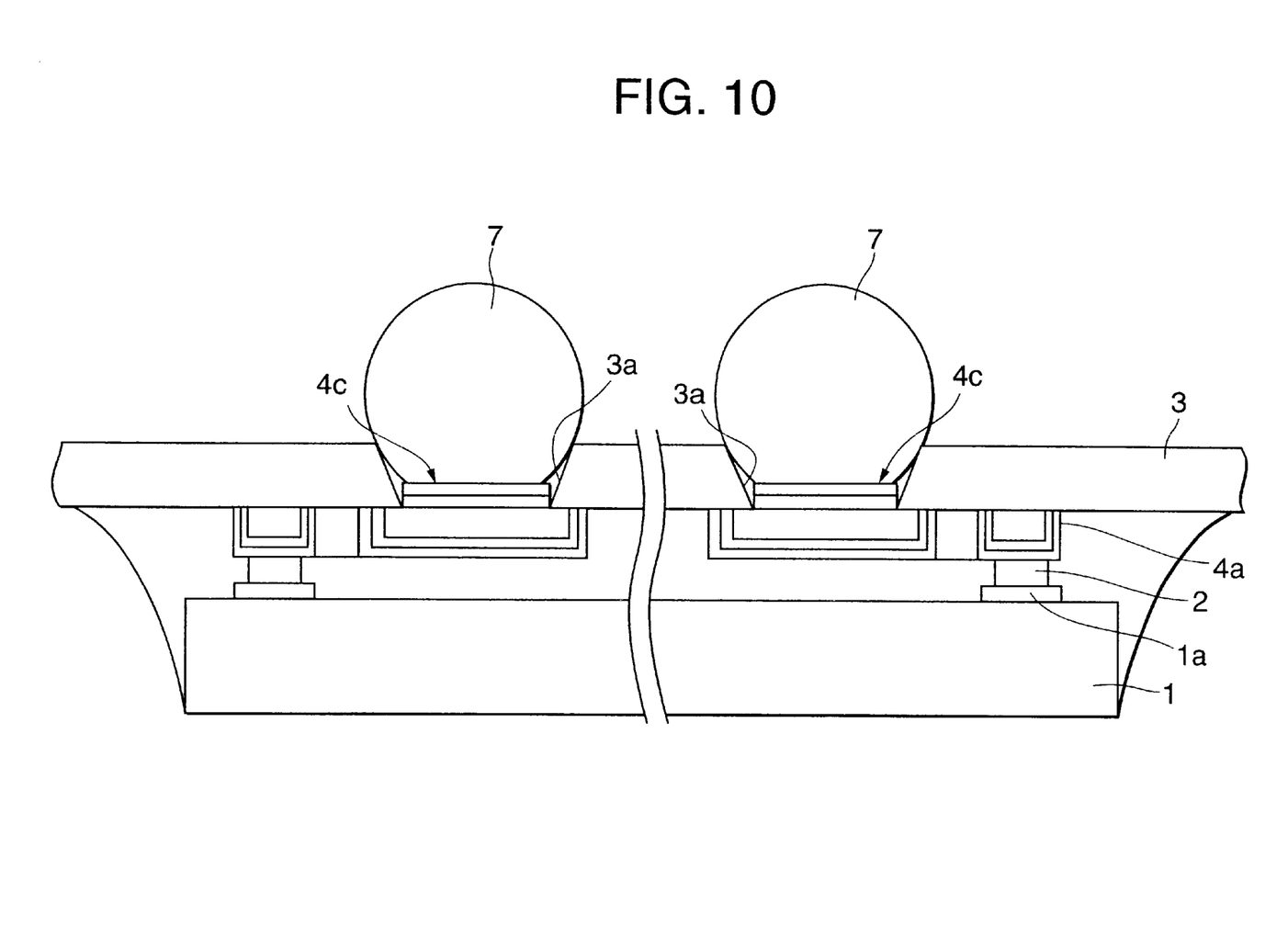
FIG. 10 is a sectional view illustrating a semiconductor device in the solder ball forming step.

Subsequently, as shown in FIG. 10, the solder bolls 7 are formed on the BGA pads 4c in the tapered openings 3a of the tape 5, respectively. Thereafter, the semiconductor devices formed on the tape 5 are cut in a size 0.5 mm larger than the chip size by a dicer to complete a single semiconductor device as shown in FIG. 2.

Here, the solder balls 7 formed on the BGA pads 4c are made of a eutectic solder of PbSn or another material. The dicer is used for cutting; however, punching or other methods are possible. The size for cutting may be that of the chip size or larger in finish.

The semiconductor device, which was prepared by above described steps, is highly reliable, can be prepared fine in the terminal pitch, is small in size, and is easy for some of product inspections.

The plasma processing in the example is effective for increasing reliability of bonding. Without the plasma processing, the Au bumps 2 of the semiconductor chip 1 cannot be crimped to the substrate pads 4a of the tape 5 under the condition of the heating temperature of 300° C. crimping time of 2.5 sec, and pressurizing force of 75 gf/bump. However, by using the plasma processing, a sufficient bonding strength (die shear strength) is yielded under the same condition. Under the condition of crimping time of 7.5 sec, and pressurizing force of 125 gf/bump. the bonding strength obtained by the plasma processing is twice or more that of the case of no plasma processing. Hence, the case of the plasma processing greatly increases the bonding strength in comparison with the case of no plasma processing.

Easy Inspection of Products

Since the insulating film 3 is transparent or almost clear, as shown in FIGS. 3 and 4, alignment and pad connection states in the chip-mounting side of the insulating film 3 can be observed by visual inspection through the Insulating film 3 using such a simple optical device as a magnifying glass or a microscope. Therefore, some of product inspections can be made easy.

As shown in FIG. 3, a bonded portion 2', where a bump 2 and a corresponding substrate pad 4a have been bonded by thermocompression bonding, can be optically observed by visual inspection of the position as indicated by a reference character Q, for example. In the case where positioning of the bump 2 and the corresponding substrate pad 4a is suitable in thermocompression bonding, the bonded portion 2' is located in the center of the substrate pad 4a.

On the other hand, in case of unsuitable positioning, as shown in the FIG. 4, it can be found by visual inspection that the bonded portion 2' is located in an eccentric position of the substrate pad 4a to discover easily a defect.

Also in the case where a bubble occurs in the sealing step, as shown in FIG. 4, voids 19 can be observed by visual inspection by visual inspection of the semiconductor device from the side of the solder balls 7 to find easily a defect product. Using such a clear film substrate allows very easy product inspection.

Another Embodiment

Figure 11:
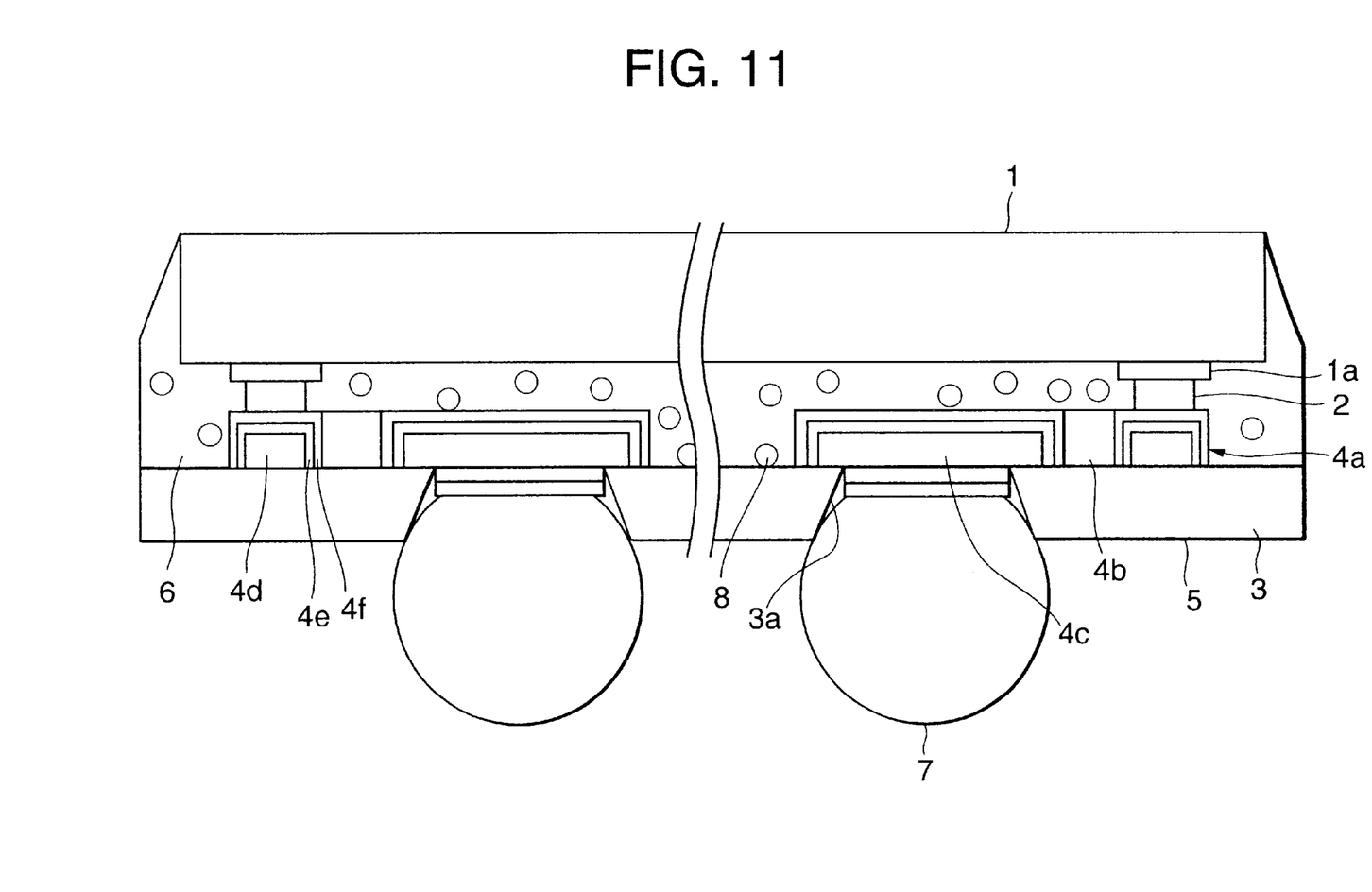
FIG. 11 is a sectional view illustrating a semiconductor device according to another embodiment of the present invention.

Referring to FIG. 11, another embodiment of the present invention has only one difference in that heat resistant cycle performance has been further increased by mixing filler 8 with the sealing resin 6. Using a conductor such as a metal as the filler 8 also yields an effect that an electromagnetic shielding is improved. Other members configuring the semiconductor device may be same as those of the above-described embodiment. The plasma irradiation same as that as described before is carried out in necessary occasions.

The present Invention is not restricted to the embodiments as described above and various modifications are possible. For example, for the sealing resin, as same as that disclosed in the Japanese Patent Application Unexamined Publication No. 8-279571 previously quoted, a configuration may be made by choosing either of two kinds of resins for filling and sealing in necessary occasions. Configuration may be also made by mixing the filler only in the sealing resin using same resin for filling and sealing or mixing the fillers different respectively in resins for filling and sealing.

As described above, according to the present invention, since the diameter of a tapered opening is increased toward the bottom surface of the insulating film, it is possible to use a solder ball, the diameter of which is larger than that of a BGA pad. Therefore, the necessary area for BGA pod is reduced, resulting In the increased freedom of wiring. Further, the fine pitch and the low profile are possible and manufacture in a low cost is possible.

According to the present invention, since a clear insulating film is used, easy visual inspection of products is allowed, resulting in reduced cost. Especially, using the film substrate made of such as polyimide with a high heat resistance allows application of the Au—Au thermocompression bonding to keep the high reliability.

What is claimed is:

1. A semiconductor device comprising:
    a semiconductor chip having a plurality of chip pads formed on one side thereof in a predetermined pattern; and
    a film substrate having the semiconductor chip connected thereon,
    wherein the film substrate comprises:
        an insulating film having a plurality of openings formed in a desired pattern;
        a wiring layer formed on a chip-connected surface of the insulating film, the chip-connected surface defining a top surface of the insulating film, the wiring layer comprising:
            a plurality of substrate pads arranged in the predetermined pattern on the top surface of the insulating film, the substrate pads each being connected to the chip pads of the semiconductor chip; and
            a plurality of external connection pads each being electrically connected to the substrate pads, the external connection pads each being formed on the top surface of the insulating film and over the openings so that the openings are covered with the external connection pads, respectively; and
        a plurality of solder balls each directly bonded to the external connection pads through the openings that expose a bottom surface of each of the external connection pads.

2. The semiconductor device according to claim 1, wherein a diameter of each of the openings tapers down in a direction toward the chip-connecting surface of the insulating film.

3. The semiconductor device according to claim 2, wherein an angle between a bottom surface of each of the external connection pads and a tapered side wall of a corresponding opening is at least 120 degrees.

4. The semiconductor device according to claim 2, wherein the insulating film is substantially transparent.

5. The semiconductor device according to claim 1, wherein the insulating film is substantially transparent.

6. The semiconductor device according to claim 1, wherein each of the substrate pads of the film substrate is connected to a corresponding one of the chip pads of the semiconductor chip through a bump made of gold.

7. The semiconductor device according to claim 6, wherein at least the substrate pads of the wiring layer are gold-plated to provide a gold-gold bond between the semiconductor chip and the film substrate.

8. The semiconductor device according to claim 6, wherein at least the substrate pads of the wiring layer are nickel-plated and thereafter gold-plated to provide a gold-gold bond between the semiconductor chip and the film substrate.

9. The semiconductor device according to claim 6, wherein the wiring layer is gold-plated.

10. The semiconductor device according to claim 9, wherein a bottom surface of each of the external connection pads in a corresponding opening is gold-plated.

11. The semiconductor device according to claim 6, wherein the wiring layer is nickel-plated and thereafter gold-plated.

12. The semiconductor device according to claim 11, wherein a bottom surface of each of the external connection pads in a corresponding opening is nickel-plated and thereafter gold-plated.

13. The semiconductor device according to claim 6, wherein the substrate pads of the film substrate are each connected to respective ones of the chip pads of the semiconductor chip after surfaces of the substrate pads have been subject to plasma cleaning processing.

14. The semiconductor device according to claim 6, wherein the insulating film is made of polyimide.

15. The semiconductor device according to claim 1, wherein a space between the film substrate and the semiconductor chip is filled with a sealing resin.

16. The semiconductor device according to claim 15, wherein the sealing resin is mixed with filler.

17. The semiconductor device according to claim 15, wherein the filler is made of a conductive material.

18. A mounting device for semiconductor chips, comprising:
an insulating film substrate halving a plurality of openings formed in a desired pattern;
a wiring layer formed on a top surface of the insulating film, the wiring layer including:
a plurality of substrate pads arranged in the predetermined pattern on the top surface of the insulating film substrate;
a plurality of external connection pads each being electrically connected to the substrate pads, the external connection pads each being formed on the top surface of the insulating film substrate and over the openings so that the openings are covered with the external connection pads; and
a plurality of solder balls each directly bonded to the external connection pads through the openings which expose a bottom surface of each of the external connection pads.

* * * * *